US008198203B2

(12) United States Patent
Lamberson et al.

(10) Patent No.: US 8,198,203 B2
(45) Date of Patent: Jun. 12, 2012

(54) ANTIMONY-FREE GLASS, ANTIMONY-FREE FRIT AND A GLASS PACKAGE THAT IS HERMETICALLY SEALED WITH THE FRIT

(75) Inventors: Lisa A. Lamberson, Painted Post, NY (US); Robert M. Morena, Lindley, NY (US)

(73) Assignee: Corning Incorporated, Corning, NY (US)

( * ) Notice: Subject to any disclaimer, the term of this patent is extended or adjusted under 35 U.S.C. 154(b) by 419 days.

(21) Appl. No.: 12/622,569

(22) Filed: Nov. 20, 2009

(65) Prior Publication Data

US 2011/0091668 A1    Apr. 21, 2011

Related U.S. Application Data

(63) Continuation of application No. PCT/US2009/060962, filed on Oct. 16, 2009.

(60) Provisional application No. 61/106,730, filed on Oct. 20, 2008.

(51) Int. Cl.
*C03C 3/21* (2006.01)
*C03C 8/08* (2006.01)
*C03C 8/24* (2006.01)
*H01J 1/62* (2006.01)
*H01J 9/26* (2006.01)

(52) U.S. Cl. ............... 501/46; 501/15; 501/21; 501/24; 313/504; 445/44

(58) Field of Classification Search .................... 501/14, 501/15, 17, 21, 24, 46; 313/504, 506, 498; 445/44
See application file for complete search history.

(56) References Cited

U.S. PATENT DOCUMENTS

| | | | |
|---|---|---|---|
| 3,414,465 A | 12/1968 | Tryggve et al. | |
| 3,614,825 A | 10/1971 | Rottmiller | 29/423 |
| 3,778,126 A | 12/1973 | Wilson | 316/20 |
| 3,973,975 A | 8/1976 | Francel et al. | 106/53 |
| 3,995,941 A | 12/1976 | Nagahara et al. | 350/160 |
| 4,206,382 A | 6/1980 | DuBois | 313/331 |
| 4,269,617 A | 5/1981 | Shibuya et al. | 65/43 |
| 4,330,596 A | 5/1982 | Van Assche | 428/428 |
| 4,400,870 A | 8/1983 | Islam | 29/588 |
| 4,748,137 A | 5/1988 | Nigrin | 501/46 |
| 4,814,298 A | 3/1989 | Nelson et al. | 501/17 |
| 5,192,240 A | 3/1993 | Komatsu | 445/24 |
| 5,246,890 A | 9/1993 | Aitken et al. | 501/15 |
| 5,281,560 A | 1/1994 | Francis et al. | 501/15 |
| 5,489,321 A | 2/1996 | Tracy et al. | 65/43 |
| 5,514,629 A | 5/1996 | Morena | 501/15 |
| 5,516,733 A | 5/1996 | Morena | 501/15 |
| 5,641,611 A | 6/1997 | Shieh et al. | 438/35 |
| 5,682,453 A | 10/1997 | Daniel et al. | 385/99 |
| 5,693,111 A | 12/1997 | Kadowaki et al. | 65/43 |
| 5,693,956 A | 12/1997 | Shi et al. | 257/40 |
| 5,733,828 A | 3/1998 | Usui et al. | 501/17 |
| 5,734,225 A | 3/1998 | Biebuyck et al. | 313/512 |
| 5,771,562 A | 6/1998 | Harvey, III et al. | 29/592.1 |
| 5,821,692 A | 10/1998 | Rogers et al. | 313/512 |
| 5,855,994 A | 1/1999 | Biebuyck et al. | 428/209 |
| 5,872,355 A | 2/1999 | Hueschen | 250/208.1 |
| 5,874,804 A | 2/1999 | Rogers | 313/512 |
| 5,895,228 A | 4/1999 | Biebuyck et al. | 438/99 |
| 5,920,080 A | 7/1999 | Jones | 257/40 |
| 5,929,474 A | 7/1999 | Huang | 257/292 |
| 5,952,778 A | 9/1999 | Haskal et al. | 313/504 |
| 5,998,805 A | 12/1999 | Shi et al. | 257/40 |
| 6,048,811 A | 4/2000 | Morena | 501/15 |
| 6,069,099 A | 5/2000 | Fewkes et al. | 501/15 |
| 6,069,443 A | 5/2000 | Jones | 313/504 |
| 6,096,496 A | 8/2000 | Frankel | 435/4 |
| 6,137,221 A | 10/2000 | Roitman et al. | 313/504 |
| 6,146,225 A | 11/2000 | Sheats et al. | 445/24 |
| 6,226,890 B1 | 5/2001 | Boroson et al. | 34/472 |
| 6,268,695 B1 | 7/2001 | Affinito | 313/504 |
| 6,291,092 B1 | 9/2001 | Kohli et al. | 429/33 |
| 6,337,381 B1 | 1/2002 | Biebuyck et al. | 528/12 |
| 6,356,376 B1 | 3/2002 | Tonar et al. | 359/267 |
| 6,370,019 B1 | 4/2002 | Matthies et al. | 361/681 |
| 6,436,222 B1 | 8/2002 | Andre et al. | 156/272.8 |

(Continued)

FOREIGN PATENT DOCUMENTS

JP    58-211743    12/1983

(Continued)

OTHER PUBLICATIONS

Milos B. Volf, "Chemical Approach to Glass", Glass Science and Technology, vol. 7, 1984, p. 349, 394 & 330. Peter C. Schultz, "Optical Absorption of the Transition Elements in Vitreous Silica", Journal of the American Ceramic Soceity, vol. 57, No. 7, pp. 309-313, Jul. 1974.
"Corning® EAGLE2000™ AMLCD Glass Substrates", MIE 201, Aug. 2002, pp. 1-3.
"Corning® AMLCD Glass Substrates", MIE 101, Aug. 2002, pp. 1-3.
M. Fritz, "Laser-fabricated glass microlens arrays", Optics Letters, vol. 23, No. 2, Jan. 15, 1998, pp. 141-143.
K. Allen, "OLED Encapsulation", Information Display Jul. 2002, p. 26-28.
H.E. Hagy, "A Review and Recent Developments of Photoelastic Techniques for the Measurement of Thermal Expansion Differentials Using Glass Seals", Thermal Conductivity, vol. 24, pp. 279-290.

(Continued)

*Primary Examiner* — Karl Group
*Assistant Examiner* — Elizabeth A Bolden
(74) *Attorney, Agent, or Firm* — Kevin M. Able

(57) ABSTRACT

An antimony-free glass suitable for use in a frit for producing a hermetically sealed glass package is described. The hermetically sealed glass package, such as an OLED display device, is manufactured by providing a first glass substrate plate and a second glass substrate plate and depositing the antimony-free frit onto the first substrate plate. OLEDs may be deposited on the second glass substrate plate. An irradiation source (e.g., laser, infrared light) is then used to heat the frit which melts and forms a hermetic seal that connects the first glass substrate plate to the second glass substrate plate and also protects the OLEDs. The antimony-free glass has excellent aqueous durability, good flow, low glass transition temperature and low coefficient of thermal expansion.

19 Claims, 1 Drawing Sheet

U.S. PATENT DOCUMENTS

| | | |
|---|---|---|
| 6,436,739 B1 | 8/2002 | Wickboldt et al. ............ 438/149 |
| 6,465,953 B1 | 10/2002 | Duggal .......................... 313/553 |
| 6,470,594 B1 | 10/2002 | Boroson et al. ................. 34/335 |
| 6,501,044 B1 | 12/2002 | Klockhaus et al. ....... 219/121.64 |
| 6,552,488 B1 | 4/2003 | Roitman et al. ............. 313/512 |
| 6,566,805 B1 | 5/2003 | Tsai et al. ..................... 313/504 |
| 6,586,496 B1 | 7/2003 | Takamatsu et al. ........... 522/168 |
| 6,608,283 B2 | 8/2003 | Liu et al. ................. 219/121.85 |
| 6,661,029 B1 | 12/2003 | Duggal .......................... 257/89 |
| 6,733,850 B1 | 5/2004 | Domi et al. ..................... 428/34 |
| 6,734,615 B2 | 5/2004 | Sugawara et al. ............. 313/480 |
| 6,737,375 B2 | 5/2004 | Burhmaster et al. ............. 501/47 |
| 6,911,667 B2 | 6/2005 | Pichler et al. ................... 257/40 |
| 6,998,776 B2 * | 2/2006 | Aitken et al. ................. 313/512 |
| 7,189,470 B2 | 3/2007 | Cortright et al. ................ 429/35 |
| 7,214,441 B2 | 5/2007 | Cortright et al. ................ 429/35 |
| 7,341,964 B2 | 3/2008 | Emlemdi ........................ 501/26 |
| 7,385,347 B2 | 6/2008 | Song et al. ..................... 313/504 |
| 7,435,695 B2 | 10/2008 | Hormadaly .................... 501/45 |
| 7,439,201 B2 | 10/2008 | Drake et al. .................... 501/15 |
| 7,545,094 B2 | 6/2009 | Choi et al. ..................... 313/504 |
| 7,564,185 B2 | 7/2009 | Song et al. ..................... 313/506 |
| 7,586,259 B2 | 9/2009 | Kwak ............................. 313/512 |
| 2001/0015620 A1 | 8/2001 | Affinito .......................... 313/512 |
| 2001/0033135 A1 | 10/2001 | Duggal et al. ................. 313/506 |
| 2001/0045565 A1 | 11/2001 | Yamazaki ....................... 257/89 |
| 2001/0048234 A1 | 12/2001 | Liu et al. ........................... 297/3 |
| 2001/0049197 A1 | 12/2001 | Yamazaki et al. ............ 438/689 |
| 2001/0053082 A1 | 12/2001 | Chipalkatti et al. .......... 362/496 |
| 2001/0055841 A1 | 12/2001 | Yamazaki et al. ............. 438/151 |
| 2002/0003571 A1 | 1/2002 | Schofield et al. .............. 348/148 |
| 2002/0004577 A1 | 1/2002 | Biebuyck et al. ................ 528/12 |
| 2002/0008463 A1 | 1/2002 | Roach ............................ 313/492 |
| 2002/0015032 A1 | 2/2002 | Koyama et al. ............... 345/204 |
| 2002/0031874 A1 | 3/2002 | Yamazaki et al. ............. 438/156 |
| 2002/0050958 A1 | 5/2002 | Matthies et al. ................ 345/55 |
| 2002/0080463 A1 | 6/2002 | Tonar et al. .................... 359/267 |
| 2002/0097368 A1 | 7/2002 | Kijima et al. ................. 349/153 |
| 2002/0109136 A1 | 8/2002 | Seo et al. ........................ 257/40 |
| 2002/0113241 A1 | 8/2002 | Kubota et al. ................... 257/79 |
| 2002/0113763 A1 | 8/2002 | Koyama .......................... 345/87 |
| 2002/0119884 A1 | 8/2002 | Burhmaster et al. ............ 501/15 |
| 2002/0125484 A1 | 9/2002 | Silvernail et al. ................ 257/79 |
| 2002/0125822 A1 | 9/2002 | Graff et al. .................... 313/506 |
| 2002/0128141 A1 | 9/2002 | Burhmaster et al. ............ 501/45 |
| 2002/0132047 A1 | 9/2002 | Yamazaki et al. ......... 427/255.6 |
| 2002/0133086 A1 | 9/2002 | Connelly et al. .............. 600/509 |
| 2002/0143258 A1 | 10/2002 | Weiner et al. ................. 600/476 |
| 2002/0149312 A1 | 10/2002 | Roberts et al. ................ 313/495 |
| 2002/0152800 A1 | 10/2002 | Bouten et al. ..................... 73/38 |
| 2002/0154379 A1 | 10/2002 | Tonar et al. .................... 359/267 |
| 2002/0182828 A1 | 12/2002 | Asami et al. .................. 438/485 |
| 2002/0187254 A1 | 12/2002 | Ghosh et al. .................... 427/58 |
| 2002/0187594 A1 | 12/2002 | Yamazaki et al. ............. 438/166 |
| 2002/0190661 A1 | 12/2002 | Duggal et al. ............. 315/169.1 |
| 2003/0017297 A1 | 1/2003 | Song et al. ...................... 428/68 |
| 2003/0066311 A1 | 4/2003 | Li et al. ............................. 65/43 |
| 2003/0158030 A1 | 8/2003 | Yamamoto et al. ............. 501/64 |
| 2003/0184219 A1 | 10/2003 | Duggal et al. ................. 313/506 |
| 2003/0222061 A1 | 12/2003 | Langer ..................... 219/121.66 |
| 2003/0227024 A1 | 12/2003 | Yoshii et al. .................... 257/99 |
| 2004/0069017 A1 | 4/2004 | Li et al. ............................. 65/43 |
| 2004/0207314 A1 | 10/2004 | Aitken et al. ................. 313/504 |
| 2005/0001545 A1 | 1/2005 | Aitken et al. ................. 313/512 |
| 2007/0007894 A1 * | 1/2007 | Aitken et al. ................. 313/512 |
| 2007/0170846 A1 | 7/2007 | Choi et al. ..................... 313/504 |
| 2007/0170849 A1 | 7/2007 | Park ............................... 313/506 |
| 2007/0170850 A1 | 7/2007 | Choi et al. ..................... 313/506 |
| 2007/0170854 A1 | 7/2007 | Kwak ............................. 313/512 |
| 2007/0170857 A1 | 7/2007 | Choi et al. ..................... 313/512 |
| 2007/0170860 A1 | 7/2007 | Choi et al. ..................... 313/512 |
| 2007/0170861 A1 | 7/2007 | Lee et al. ....................... 313/512 |
| 2007/0171637 A1 | 7/2007 | Choi ............................... 362/227 |
| 2007/0176550 A1 | 8/2007 | Kwan ............................. 313/512 |
| 2007/0176551 A1 | 8/2007 | Kwak ............................. 313/512 |
| 2007/0176563 A1 | 8/2007 | Kim et al. .................. 315/169.3 |
| 2007/0188079 A1 | 8/2007 | Song ............................... 313/504 |
| 2007/0243991 A1 | 10/2007 | Brow et al. ..................... 501/45 |
| 2008/0048556 A1 | 2/2008 | Logunov et al. .............. 313/504 |
| 2008/0106194 A1 * | 5/2008 | Logunov et al. .............. 313/512 |
| 2009/0009063 A1 | 1/2009 | Botelho et al. ................. 313/504 |
| 2009/0069164 A1 * | 3/2009 | Lamberson et al. ............ 501/15 |
| 2009/0218932 A1 | 9/2009 | Wang ............................. 313/504 |
| 2009/0247385 A1 | 10/2009 | Ide ................................... 501/18 |

FOREIGN PATENT DOCUMENTS

| | | |
|---|---|---|
| JP | 62-078128 | 4/1987 |
| JP | 10-074583 | 3/1998 |
| JP | 2001-319775 | 11/2001 |
| JP | 2003-187962 | 7/2003 |
| KR | 10-2009-0041867 | 4/2009 |
| WO | WO 93/12049 | 6/1993 |
| WO | WO 00/57499 | 9/2000 |
| WO | WO 01/05205 | 1/2001 |
| WO | WO 01/44865 | 6/2001 |
| WO | WO 02/05361 | 1/2002 |
| WO | WO 02/21557 | 3/2002 |
| WO | WO 03/005774 | 12/2003 |
| WO | WO 03/100832 | 12/2003 |
| WO | 2007/067402 | 6/2007 |

OTHER PUBLICATIONS

H. Hirashina et al., "Electrical Conductivity of $Fe_2O_3$—$V_2O_5$—$P_2O_5$ Glasses", Journal of the American Ceramic Society, vol. 66, No. 109, Oct. 1983, pp. 704-708.

H. Hirashima et al., "Effect of Basic Additive Oxides on Electrical Conductivity of Vanadate Glasses", Journal of Non-Crystalline Solids, vol. 95 & 96, 1987, pp. 817-824.

"Standard Practice for Making Reference Glass-Metal Sandwich Seal and Testing for Expansion Characteristics by Polarimetric Methods", The American Society of Testing Materials—Designation: F144-80 (Reapproved 2000), pp. 502-506.

* cited by examiner

ANTIMONY-FREE GLASS, ANTIMONY-FREE FRIT AND A GLASS PACKAGE THAT IS HERMETICALLY SEALED WITH THE FRIT

CROSS REFERENCE TO RELATED APPLICATIONS

This application is a continuation of International Application No. PCT/US2009/60962 filed on Oct. 16, 2009, which claims the benefit of priority to U.S. Provisional Application No. 61/106,730 filed on Oct. 20, 2008, both applications being incorporated herein by reference.

TECHNICAL FIELD

The present invention relates to an antimony-free glass, a fit made therefrom, and a hermetically sealed glass packages sealed with the frit that is suitable to protect thin film devices that are sensitive to the ambient environment. Some examples of such devices are organic emitting light diode (OLED) displays, sensors, photovoltaic and other optical devices. The present invention is demonstrated using OLED displays as an example.

BACKGROUND

OLEDs have been the subject of a considerable amount of research in recent years because of their use and potential use in a wide variety of electroluminescent devices, and are now reaching commercialization. For instance, a single OLED can be used in a discrete light emitting device or an array of OLEDs can be used in lighting applications or flat-panel display applications (e.g., OLED displays). OLED displays are known as being very bright and having a good color contrast and wide viewing angle. However, OLED displays, and in particular the electrodes and organic layers located therein, are susceptible to degradation resulting from interaction with oxygen and moisture leaking into the OLED display from the ambient environment. It is well known that the life of the OLED display can be significantly increased if the electrodes and organic layers within the OLED display are hermetically sealed from the ambient environment. Unfortunately, in the past it was very difficult to develop a sealing process to hermetically seal the OLED display. Some of the factors that made it difficult to properly seal the OLED display are briefly mentioned below:

The hermetic seal should provide a barrier for oxygen ($10^{-3}$ cc/m$^2$/day) and water ($10^{-6}$ g/m$^2$/day).

The size of the hermetic seal should be minimal (e.g., <2 mm) so it does not have an adverse effect on size of the OLED display.

The temperature generated during the sealing process should not damage the materials (e.g., electrodes and organic layers) within the OLED display. For instance, the first pixels of OLEDs which are located about 1-2 mm from the seal in the OLED display should not be heated to more than 100° C. during the sealing process.

The gases released during the sealing process should not contaminate the materials within the OLED display.

The hermetic seal should enable electrical connections (e.g., thin-film chromium) to enter the OLED display.

Today, one method for sealing the OLED display is to use different types of epoxies, inorganic materials and/or organic materials that form the seal after they are cured by ultra-violet light. For example, some seals use a composite-based approach where alternate layers of inorganic materials and organic materials can be used to seal the OLED display. Although these types of seals usually provide good mechanical strength, they can be very expensive and there are many instances in which they have failed to prevent the diffusion of oxygen and moisture into the OLED display. Another common way for sealing the OLED display is to utilize metal welding or soldering. However, the resulting seal is not durable in a wide range of temperatures because of the substantial differences between the coefficients of thermal expansions (CTEs) of the glass plates and metal in the OLED display.

More recently, glass-based fits have been used to seal glass substrate plates in a glass package that provides excellent hermeticity to the enclosed device. But many of these fits contain toxic elements, such as antimony, which pose environmental hazards. There is a need for a glass-based frit suitable for hermetically sealing glass packages, such as electronic devices (e.g. for display-type applications), having a low coefficient of thermal expansion (CTE) that does not contain antimony.

SUMMARY

The present invention includes a hermetically sealed OLED display and method for manufacturing the hermetically sealed OLED display. Basically, the hermetically sealed OLED display is manufactured by providing a first glass substrate plate and a second glass substrate plate and depositing a frit onto the second glass substrate plate. An organic material, such as those used in the manufacture of an OLED may be deposited on the first substrate plate. An irradiation source (e.g., laser, infrared light) is then used to heat the frit which melts and forms a hermetic seal that connects the first glass substrate plate to the second glass substrate plate and also protects the OLEDs. The frit is and antimony-free glass that contains vanadium, and possibly a CTE lowering filler, such that when the irradiation source heats the frit, it softens and forms a bond. This enables the frit to melt and form the hermetic seal while avoiding thermal damage to the OLEDs. Vanadium phosphate fits, for example, have proven especially suitable for sealing glass packages of the type just described, and in particular antimony-containing vanadium phosphate frits. Such frits are very stable, exhibit high optical absorbance and have excellent mechanical and aqueous durability. Unfortunately, antimony is a toxic element, and efforts have been directed toward finding a replacement for antimony that does not detrimentally affect the other beneficial attributes of the frit.

To that end, the excellent aqueous durability performance of Sb-vanadium phosphate frits was maintained without Sb$_2$O$_3$ by replacement of the antimony oxide by a combination of Fe$_2$O$_3$+TiO$_2$, along with a small addition of ZnO to maintain flow and glass transition temperature (T$_g$). The presence of Fe$_2$O$_3$ was found to have the greatest effect in improving durability. However, it raised T$_g$, thus degrading frit flow during sealing. In addition, fits with high Fe$_2$O$_3$ levels (equal to or greater than about 25 mole %) tended to be oxidatively unstable, with repeat samples fired to the same schedule (425° in N$_2$) exhibiting different colors (brown or black), with marked differences in the degree of flow. Although TiO$_2$ alone actually degraded aqueous durability to some extent, the combination of (Fe$_2$O$_3$+TiO$_2$) proved to be an ideal combination from the standpoint of obtaining laser-sealable frits with both high aqueous durability and low T$_g$ ($\cong$400° C.).

Both lab bench tests exposing the glass to 90° C. distilled water as well as 85° C./85% relative humidity (RH) environmental chamber testing of laser-sealed samples indicate that fits based on the Fe$_2$O$_3$—TiO$_2$—ZnO—V$_2$O$_5$—P$_2$O$_5$ system are capable of forming a hermetic seal after laser-sealing that will withstand high humidity conditions for extended times (≧1000 hrs). An unexpected result of the ($Fe_2O_3$+$TiO_2$) replacement of $Sb_2O_3$ was that the CTE of the base frit glass decreased by approximately half (from 70-80×10$^{-7}$/°C. to 35-45×10$^{-7}$/°C.), with only a minor increase in $T_g$ (355°C. to 370°C.). Typically, low $T_g$ glasses and fits have CTE values in the range 100-150×10$^{-7}$/°C. Frits with CTE values near 40×10$^{-7}$/°C. have the potential, with the addition of fillers such as β-eucryptite, of being able to seal fused silica and other low CTE substrates such as Kovar™.

In one embodiment an antimony-free glass is disclosed comprising:
$V_2O_5$ (40-50 mole %)
$P_2O_5$ (≧20 mole % and <25 mole %)
ZnO (0-10 mole %)
$Fe_2O_3$ (>0 mole % and <25 mole %)
$TiO_2$ (>0% and <25 mole %); and
wherein $TiO_2$+$Fe_2O_3$ is in the range from 20 mole % to 35 mole %.

In another embodiment an antimony-free glass according to claim 1, comprising:
$V_2O_5$ (40-50 mole %)
$P_2O_5$ (≧20 mole % and <25 mole %)
ZnO (5-10 mole %)
$Fe_2O_3$ (>0 mole % and <25 mole %)
$TiO_2$ (>0% and <25 mole %); and
wherein $TiO_2$+$Fe_2O_3$ is in the range from 20 mole % to 35 mole %.

In still another embodiment, an antimony-free glass is described having the following composition:
$V_2O_5$ (40 mole %)
$P_2O_5$ (20 mole %)
ZnO (5 mole %)
$Fe_2O_3$ (>0 mole % and <25 mole %)
$TiO_2$ (>0 mole % and <25 mole %); and
wherein $TiO_2$+$Fe_2O_3$ is 35 mole %.

In another embodiment an antimony-free glass is disclosed comprising:
$V_2O_5$ (50 mole %)
$P_2O_5$ (20 mole %)
ZnO (10 mole %)
$Fe_2O_3$ (>10 mole % and ≦15 mole %)
$TiO_2$ (>5 mole % and ≦10 mole %); and
wherein $TiO_2$+$Fe_2O_3$ is 20 mole %.

The antimony-free glass preferably has a $T_g$≦400°C. and a CTE in the range from 35×10$^{-7}$/°C. to 45×10$^{-7}$/°C. The antimony-free glass may, for example, comprise a glass frit and optionally a CTE lowering filler such as beta eucryptite.

In still another embodiment, an antimony-free glass is described consisting of
$V_2O_5$ (40-50 mole %)
$P_2O_5$ (≧20 mole % and <25 mole %)
ZnO (0-10 mole %)
$Fe_2O_3$ (>0 mole % and ≦20 mole %)
$TiO_2$ (>0% and ≦20 mole %); and
wherein $TiO_2$+$Fe_2O_3$ is in the range from 20 mole % to 35 mole %.

In another embodiment, an antimony-free glass is disclosed comprising:
$V_2O_5$ (40-50 mole %)
$P_2O_5$ (≧20 mole % and <25 mole %)
ZnO (5-10 mole %)
$Fe_2O_3$ (>0 mole % and ≦20 mole %)
$TiO_2$ (>0% and ≦20 mole %); and
wherein $TiO_2$+$Fe_2O_3$ is in the range from 20 mole % to 35 mole %.

In yet another embodiment, a glass package is described comprising:
a first glass plate;
a second glass plate; and
a frit that connects the first glass plate to the second glass plate and forms an hermetic seal therebetween, the frit including an antimony-free glass comprising:
$V_2O_5$ (40-50 mole %)
$P_2O_5$ (≧20 mole % and <25 mole %)
ZnO (0-10 mole %)
$Fe_2O_3$ (>0 mole % and <25 mole %)
$TiO_2$ (>0 mole % and <25 mole %); and
wherein $TiO_2$+$Fe_2O_3$ is in the range from 20 mole % to 35 mole %.

The antimony-free glass of the frit may instead comprise:
$V_2O_5$ (40 mole %)
$P_2O_5$ (20 mole %)
ZnO (5 mole %)
$Fe_2O_3$ (>0 mole % and <25 mole %)
$TiO_2$ (>0 mole % and <25 mole %); and
wherein $TiO_2$+$Fe_2O_3$ is 35 mole %.

In other embodiments, the antimony-free glass of the frit may comprise:
$V_2O_5$ (50 mole %)
$P_2O_5$ (20 mole %)
ZnO (10 mole %)
$Fe_2O_3$ (>10 mole % and ≦15 mole %)
$TiO_2$ (>5 mole % and ≦10 mole %); and
wherein $TiO_2$+$Fe_2O_3$ is 20 mole %.

In some embodiments, the antimony-free glass of the frit comprises:
$V_2O_5$ (40-50 mole %)
$P_2O_5$ (≧20 mole % and <25 mole %)
ZnO (5-10 mole %)
$Fe_2O_3$ (>0 mole % and <25 mole %)
$TiO_2$ (>0 mole % and <25 mole %); and
wherein $TiO_2$+$Fe_2O_3$ is in the range from 20 mole % to 35 mole %.

Preferably, the antimony-free glass comprising the frit has a Tg≦400°C. Preferably, the antimony-free glass of the frit has a CTE in the range from 35×10$^{-7}$/°C. to 45×10$^{-7}$/°C. The frit may optionally comprise a CTE-lowering filler.

In some embodiments the glass package may further comprise an organic material, such as an organic material comprising an organic light emitting diode, disposed between the first and second glass plates.

The invention will be understood more easily and other objects, characteristics, details and advantages thereof will become more clearly apparent in the course of the following explanatory description, which is given, without in any way implying a limitation, with reference to the attached Figures. It is intended that all such additional systems, methods, features and advantages be included within this description, be within the scope of the present invention, and be protected by the accompanying claims.

DETAILED DESCRIPTION

Figure 1:
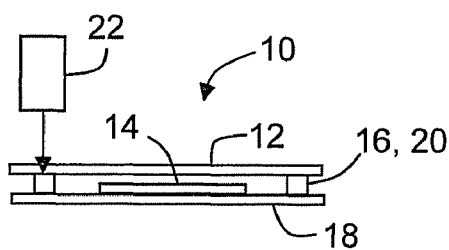
FIG. 1 is a cross sectional illustration of the sealing of an exemplary OLED device using a frit according to embodiments of the present invention.

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

FIG. 1 depicts a cross-sectional side view illustrating the sealing of the basic components of a hermetically sealed OLED display 10. OLED display 10 includes a multilayer sandwich of a first glass substrate plate 12, one or more OLEDs 14, frit 16 and a second glass substrate plate 18. OLED display 10 comprises hermetic seal 18 formed from frit 16 that protects OLEDs 14 located between the first glass substrate plate 12 and the second glass substrate plate 18. Hermetic seal 20 is typically located around the perimeter of OLED display 10. OLEDs 14 are located within a perimeter of hermetic seal 20. The composition of frit 16, and more particularly the composition of the glass of frit 16, as well as how the hermetic seal 20 is formed from frit 16 is described in greater detail below.

In one embodiment, first and second substrate plates 12 and 18 are transparent glass plates. Frit 16 is deposited along the edges of second glass substrate plate 18. For instance, frit 16 can be placed approximately 1 mm away from the free edges of the second glass substrate plate 18. In the preferred embodiment, frit 16 is a low temperature antimony-free glass frit containing vanadium to enhance the optical absorbance of the frit. Frit 16 may also include a filler, such a beta eucryptite, that lowers the coefficient of thermal expansion (CTE) of the frit so that it matches or substantially matches the CTEs of the two glass substrate plates 12 and 18.

OLEDs 14 and other circuitry are deposited onto second glass substrate plate 18. The typical OLED 14 includes an anode electrode, one or more organic layers and a cathode electrode. However, it should be readily appreciated that other environmentally sensitive components can be deposited onto second glass substrate plate 18.

Optionally, frit 16 can be pre-sintered to first glass substrate plate 12 prior to sealing glass substrates 12 and 18 together. To accomplish this, first substrate plate 12 comprising frit 16 deposited thereon is heated in a furnace or oven so that it becomes attached to the first glass substrate plate 12.

Next, first and second glass substrate plates 12 and 18 are brought together with frit 16 and one or more OLEDs positioned between them, and frit 16 is irradiated by irradiation source 22 (e.g. a laser or an infrared lamp) so that the frit 16 forms hermetic seal 20 that connects and bonds the first substrate plate 12 to second substrate plate 18. Hermetic seal 18 also protects OLEDs 14 by preventing oxygen and moisture in the ambient environment from entering into the OLED display 10.

It should be readily appreciated that the irradiating wavelength should be within the band of high absorption in the particular frit 16. For instance, Ytterbium (900 nm<$\lambda$<1200 nm), Nd:YAG=1064 nm), Nd:YALO ($\lambda$=1.08 µm), and erbium ($\lambda \approx$1.5 µm) CW lasers can be used depending on the optical properties of the particular frit 16 and glass substrate plates 12 and 18.

It should be noted that most traditional low temperature sealing frits are PbO-based, because PbO frits have good flow, and adhesion properties. However, the antimony-free frits disclosed herein not only have a lower CTE than PbO-based frits, but also possess better aqueous durability, as well as being comparable to the traditional Pb-based frits with respect to adhesion.

In addition, although the role played by $P_2O_5$ in a successful sealing frit is important, since it permits stable glasses to be formed, from a laser-sealing and post-seal performance standpoint the effect of $Sb_2O_3$ and $V_2O_5$ should not be ignored. In previous testing, seals made with Sb-free, Zn-based vanadium-phosphate frits could only survive the relatively benign environment of 60° C./40% RH, while seals made from mixed Sb—Zn vanadium phosphate frits survived 60° C./85% RH before failing. Conversely, only seals made with Sb-vanadium-phosphate frits survived 85° C./85% RH exposure. However, despite the role that $Sb_2O_3$ plays in improving aqueous durability, feedback from potential customers consistently raise concerns about its presence. Thus, recent emphasis has been placed on development of a glass suitable for a sealing frit that is environmentally friendly, noting that antimony is a toxic element.

Work on $Sb_2O_3$-free compositions began by first expressing a basic OLED device sealing frit composition as a three component system (20 mole % $Sb_2O_3$—50 mole % $V_2O_5$—30 mole % $P_2O_5$), simplifying the composition to a two component $Sb_2O_3$-free system (either 50 mole % $V_2O_5$—30 $P_2O_5$, 45 mole % $V_2O_5$—30 mole % $P_2O_5$, or 40 mole % $V_2O_5$—20 mole % $P_2O_5$), and then identifying the remaining components from the standpoint of their effect on aqueous durability, flow, glass transition temperature ($T_g$), and laser-sealability. Both aqueous durability, laser-sealability, and flow of any candidate frit compositions needed to be comparable to the $Sb_2O_3$-containing control sample, while the Tg requirements were relaxed with the criterion that $T_g$ had to be equal to or less than 400° C. (Frits with $T_g$>400° are unlikely to flow sufficiently during the presintering step for OLED frits to be handleable in subsequent processing.) The following oxides were investigated as potential substitutes for antimony ($Sb_2O_3$): $WO_3$, $MoO_3$, $TeO_2$, $Bi_2O_3$, $Fe_2O_3$, and $TiO_2$. ZnO was also investigated, although in view of the poor durability results obtained for a ZnO—$V_2O_5$—$P_2O_5$ frit, it was considered only as a minor component (5-10%) to lower $T_g$ and maintain flow. The various oxides selected were chosen on the basis that they formed stable binary glasses with $V_2O_5$.

All of the compositions investigated were melted, poured as glass patties, then ball-milled to form fine-particle frits (typically with a $d_{50}$=3-5 µm). A key bench test to screen the different compositions was to prepare and fire flow buttons of the various frits, and then to assess their aqueous durability. The flow buttons were fired in $N_2$ to 400-450° C. (depending upon $T_g$ and crystallization tendency). After firing, the flow buttons were immersed in 90° C. de-ionized water for 48 hours to assess their aqueous durability. Control samples of the OLED frit (either as the D1 base glass, or as a 70:30 blend of the base glass with a β-eucryptite filler) were also included in each evaluation. Of the potential replacements for $Sb_2O_3$ that were investigated (see above), only $TiO_2$ and $Fe_2O_3$ appeared promising.

Listed in Tables 1 and 2 are results for a 50 mole % $V_2O_5$—30 mole % $P_2O_5$ composition series with $WO_3$, $MoO_3$, $WO_3$+

ZnO, Bi$_2$O$_3$, and TeO$_2$ as the third component. Also shown are data on the standard OLED base glass, D1, as a comparison standard. All compositions (given in mole %) were evaluated for quality of glass formed from the pour, glass transition temperature (T$_g$) by DSC, flow and sinterability as a 3 μm powder hand-pressed into a pellet ("flow button") and fired at 400° C. for 1 hour in N$_2$, and aqueous durability (as gauged by the color of the supernatant for a fired flow button sample—the darker the color, the less durable the sample) in the bench aqueous durability test described above. Note that none of the potential Sb$_2$O$_3$ replacements listed in Tables 1 and 2 produced the acceptable level of glass quality, T$_g$, flow, and aqueous durability exhibited by the Sb$_2$O$_3$-containing control (as judged by the appearance of the supernatant after 48 hrs, 90° C. de-ionized H$_2$O).

TABLE 1

| | D1 (control) | D2 | D3 |
|---|---|---|---|
| Composition (molar basis) | Sb$_2$O$_3$, 22.9<br>V$_2$O$_5$, 46.4<br>P$_2$O$_5$, 26.3<br>Fe$_2$O$_3$, 2.4<br>Al$_2$O$_3$, 1.0<br>TiO$_2$, 1.0 | V$_2$O$_5$, 50<br>P$_2$O$_5$, 30<br>WO$_3$, 20 | V$_2$O$_5$, 50<br>P$_2$O$_5$, 30<br>MoO$_3$, 20 |
| Glass quality at pour | Excellent | Fluid, good quality | Very fluid, good quality |
| T$_g$ | 355° C. | 349° C. | 315° C. |
| Flow (400°-1 hr, N$_2$) | Very good flow and sinterability | Semi-glossy, well-sintered, no flow | Glossy and black with some slump |
| Aqueous durability, appearance of supernatant (48 hrs, 90° C. D.I. H$_2$O) | V. slightly tinted | Black | Black |

TABLE 2

| | D4 | D5 | D6 |
|---|---|---|---|
| Composition (molar basis) | V$_2$O$_5$, 50<br>P$_2$O$_5$, 30<br>WO$_3$, 10<br>ZnO, 10 | V$_2$O$_5$, 50<br>P$_2$O$_5$, 30<br>Bi$_2$O$_3$, 20 | V$_2$O$_5$, 50<br>P$_2$O$_5$, 30<br>TeO$_2$, 20 |
| Glass quality at pour | Good glass, fluid, poured well | Crystallized after pouring | More viscous pour, glass looked good |
| T$_g$ | 323° C. | Not eval. | 329° C. |
| Flow (400° C.-1 hr, N$_2$) | Poor flow | Not eval. | Semi-glossy black, no slump |
| Aqueous durability | Black | Not eval. | Black |

More positive results for Sb$_2$O$_3$-free vanadium phosphate frits were obtained by Fe$_2$O$_3$ and/or TiO$_2$ replacement of Sb$_2$O$_3$ (see Tables 3 and 4). All compositions are expressed in mole %. Several combinations of Fe$_2$O$_3$+TiO$_2$ produced good glasses at pouring. High TiO$_2$ glasses (i.e., ≧25%) such as D8 had acceptable T$_g$ and flow properties, but also exhibited poor aqueous durabilities. Higher Fe$_2$O$_3$ glasses (i.e., ≧25 or 30%) such as D7 and D11 tended to produce poor glasses at pour, as evidenced by substantial surface devitrification. The relatively poor stability of these glasses (as indicated by the high amount of surface devitrification formed in the patty at pouring) resulted in poor flow as frits. They also tended to be unstable with respect to oxidation state, with a fired flow button from the same lot of powder alternately appearing either black (reduced) or red (oxidized) after the same firing conditions. Also included in Table 4 is D14, a glass with relatively high Fe$_2$O$_3$ and TiO$_2$ levels, but with 10 mole % ZnO to lower the expected increase in T$_g$ from the Fe$_2$O$_3$. Note that a second approach to accommodating high Fe$_2$O$_3$ levels is increasing the V$_2$O$_5$ content. But as may be seen for D9 and D10, aqueous durability was compromised at higher V$_2$O$_5$ content.

TABLE 3

| | D7 | D8 | D9 | D10 |
|---|---|---|---|---|
| Composition (molar basis) | V$_2$O$_5$, 45<br>P$_2$O$_5$, 30<br>Fe$_2$O$_3$, 25 | V$_2$O$_5$, 45<br>P$_2$O$_5$, 30<br>TiO$_2$, 25 | V$_2$O$_5$, 50<br>P$_2$O$_5$, 30<br>TiO$_2$, 15<br>Fe$_2$O$_3$, 5 | V$_2$O$_5$, 50<br>P$_2$O$_5$, 30<br>TiO$_2$, 10<br>Fe$_2$O$_3$, 10 |
| Glass quality at pour | Substantial surface devit | Poured nicely | Poured nicely | Poured nicely |
| T$_g$ | 353° | 345° | 323° | 322° |
| Flow (400° C., 1 hr, N$_2$) | Poorly sintered | Semi-glossy black, no slump | Sintered, some flow | Sintered, slight flow |
| Aqueous durability, appearance of supernatant (48 hrs, 90° C. D.I. H$_2$O) | Not tested | Black | Med. green | Med. green |

TABLE 4

| | D11 | D12 | D13 | D14 |
|---|---|---|---|---|
| Composition (molar basis) | V$_2$O$_5$, 42<br>P$_2$O$_5$, 28<br>TiO$_2$, 0<br>Fe$_2$O$_3$, 30 | V$_2$O$_5$, 40<br>P$_2$O$_5$, 25<br>TiO$_2$, 17.5<br>Fe$_2$O$_3$, 17.5 | V$_2$O$_5$, 45<br>P$_2$O$_5$, 25<br>TiO$_2$, 0<br>Fe$_2$O$_3$, 30 | V$_2$O$_5$, 40<br>P$_2$O$_5$, 20<br>TiO$_2$, 15<br>Fe$_2$O$_3$, 15<br>ZnO, 10 |
| Glass quality at pour | Viscous, surface devit | Good glass, no devit | Viscous, surface devit | Good glass, no devit |
| T$_g$ | 371° | 364° | 376° | 360° |
| Flow (400° C., 1 hr, N$_2$) | Poor - powdery and unconsolidated | Poor - powdery | Poor | Semi-glossy black, sintered, no slump |
| Aqueous durability | Not eval. | Not eval. | Not eval. | Lt. brown |

It should also be noted that although the test samples of Tables 3 and 4 having P$_2$O$_5$ levels equal to or greater than 25 mole percent performed poorly, it is anticipated that P$_2$O$_5$ levels less than 25 mole % can be successfully employed. Table 5 summarizes the results of a second set of Fe$_2$O$_3$ and TiO$_2$ melts at 10% ZnO. All compositions are expressed in mole %. As for the initial series, some combination of Fe$_2$O$_3$ and TiO$_2$ is preferred, since Fe$_2$O$_3$ contributes excellent aqueous durability (but at the cost of high T$_g$ and reduced frit sintering at 400°), and TiO$_2$ results in lower T$_g$ and improved flow (but at the cost of aqueous durability).

TABLE 5

| | D15 | D16 | D17 | D18 | D19 |
|---|---|---|---|---|---|
| Composition (molar basis) | V$_2$O$_5$, 50<br>P$_2$O$_5$, 20<br>ZnO, 10<br>Fe$_2$O$_3$, 0 | V$_2$O$_5$, 50<br>P$_2$O$_5$, 20<br>ZnO, 10<br>Fe$_2$O$_3$, 5 | V$_2$O$_5$, 50<br>P$_2$O$_5$, 20<br>ZnO, 10<br>Fe$_2$O$_3$, 10 | V$_2$O$_5$, 50<br>P$_2$O$_5$, 20<br>ZnO, 10<br>Fe$_2$O$_3$, 15 | V$_2$O$_5$, 50<br>P$_2$O$_5$, 20<br>ZnO, 10<br>Fe$_2$O$_3$, 20 |

TABLE 5-continued

|  | D15 | D16 | D17 | D18 | D19 |
|---|---|---|---|---|---|
| Glass quality at pour | $TiO_2$, 20 Poured nicely | $TiO_2$, 15 Poured nicely | $TiO_2$, 10 Poured nicely | $TiO_2$, 5 Poured nicely | $TiO_2$, 0 Poured nicely |
| $T_g$ | 297° | 310° | 322° | 333° | 348° |
| Flow (400°-1 hr, $N_2$) | Well-sintered, good flow | Well-sintered, good flow | Sintered, slight flow | Sintered, some flow | Sintered, little flow |
| Aqueous durability | Dark black | Dark black | Dark black | Clear | Clear |

Figure 2:
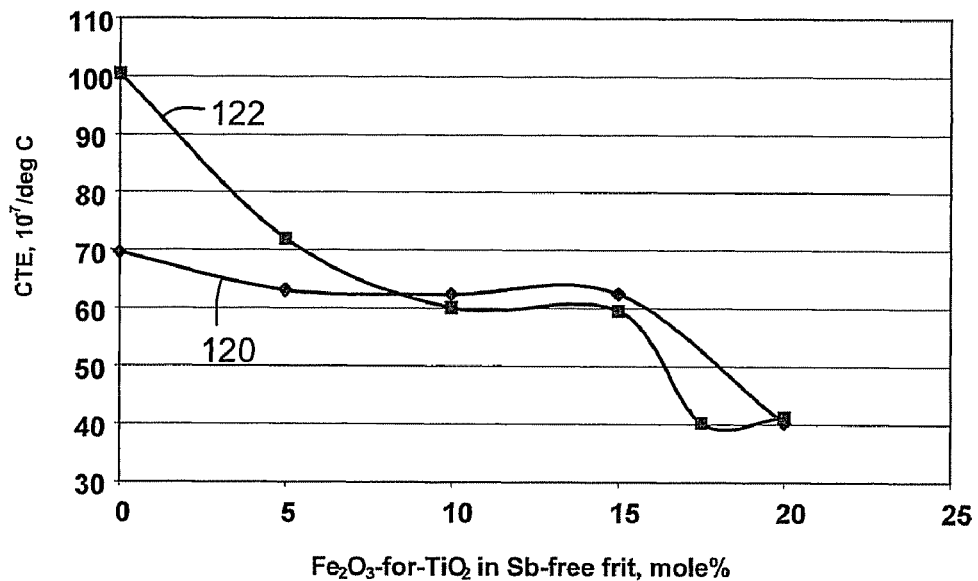
FIG. 2 is a plot of coefficient of thermal expansion (CTE) as a function of the substitution of $Fe_2O_3$ for $TiO_2$ in an Sb-free frit according to embodiments of the present invention in mole % where $Fe_2O_3$+$TiO_2$ is between 20 mole % and 35 mole %.

An additional series of melts were made at higher levels of [$Fe_2O_3$+$TiO_2$] with ZnO maintained at 5 mole % (see Tables 6 and 7 below). All compositions are expressed in mole %. Note that to accommodate the higher $T_g$ of the high $Fe_2O_3$ glasses, flow was evaluated at 425° C., rather than the 400° C. previously used.

levels. Shown below in FIG. 2 are CTE data for sintered fits whose composition is listed in Tables 3, 4 and 5. Data are presented for all sinterable fits in the 20 mole % ($Fe_2O_3$+$TiO_2$) series of Table 3, 4, (curve 120) and for the 35 mole % ($Fe_2O_3$+$TiO_2$) series of Table 5 (curve 122). CTE data for sintered frit bars are plotted as a function of $Fe_2O_3$ level in

TABLE 6

|  | D20 | D21 | D22 | D23 |
|---|---|---|---|---|
| Composition (molar basis) | $V_2O_5$, 40 $P_2O_5$, 20 ZnO, 5 $Fe_2O_3$, 35 $TiO_2$, 0 | $V_2O_5$, 40 $P_2O_5$, 20 ZnO, 5 $Fe_2O_3$, 30 $TiO_2$, 5 | $V_2O_5$, 40 $P_2O_5$, 20 ZnO, 5 $Fe_2O_3$, 25 $TiO_2$, 10 | $V_2O_5$, 40 $P_2O_5$, 20 ZnO, 5 $Fe_2O_3$, 20 $TiO_2$, 15 |
| Glass quality at pour | Substantial surface + bulk devit | Surface devit | Surface devit | Good glass, no devit |
| $T_g$ | 416° | 407° | 400° | 389° |
| Flow (425°-1 hr, $N_2$) | Not sinterable at 425° | Not sinterable at 425° | Not sinterable at 425° | Sintered, no flow |
| Aq. durability | Not tested | Not tested | Not tested | Clear |

TABLE 7

|  | D24 | D25 | D26 | D27 | D28 |
|---|---|---|---|---|---|
| Composition (molar basis) | $V_2O_5$, 40 $P_2O_5$, 20 ZnO, 5 $Fe_2O_3$, 17.5 $TiO_2$, 17.5 | $V_2O_5$, 40 $P_2O_5$, 20 ZnO, 5 $Fe_2O_3$, 15 $TiO_2$, 20 | $V_2O_5$, 40 $P_2O_5$, 20 ZnO, 5 $Fe_2O_3$, 10 $TiO_2$, 25 | $V_2O_5$, 40 $P_2O_5$, 20 ZnO, 5 $Fe_2O_3$, 5 $TiO_2$, 30 | $V_2O_5$, 40 $P_2O_5$, 20 ZnO, 5 $Fe_2O_3$, 0 $TiO_2$, 35 |
| Glass quality at pour | Good glass, no devit | Good glass, no devit | Good glass, no devit | Good glass, no devit | Good glass, no devit |
| $T_g$ | 379° | 367° | 351° | 333° | 324° |
| Flow (425°-1 hr, $N_2$) | Sintered, slight flow | Sintered, slight flow | Sintered, mod. flow | Sintered, mod. flow | Sintered, good flow |
| Aq. durability | Clear with v. slight tint | Clear | Med. green | Med. green (residue) | Med. green (residue) |

As seen in previous results from Tables 1, 2 and 3, 4, $Fe_2O_3$ levels not much higher than 20 mole % (e.g. about 25 mole %) resulted in fits with high $T_g$, poor stability, and unacceptable flow during 400-425° sintering. Similarly, $TiO_2$ not much higher than 20 mole % (e.g. about 25%), resulted in fits with acceptable $T_g$, flow, and stability, but with unacceptable aqueous durability. Frits with $Fe_2O_3$ levels ranging between from about 10 to less than 25 mole %, and with $TiO_2$ levels from about 15 to less than 25 mole % (at 5-10 mole % ZnO) combine excellent aqueous durability with acceptable flow, $T_g$, and glass stability.

The aqueous durability of the ($Fe_2O_3$+$TiO_2$+ZnO) $Sb_2O_3$-free $V_2O_5$—$P_2O_5$ fits were found to be comparable to or slightly superior to the $Sb_2O_3$-containing standard composition. An unexpected result of the $Sb_2O_3$-free work is that the coefficient of thermal expansion (CTE) becomes dramatically lower for the ($Fe_2O_3$+$TiO_2$+ZnO) fits at higher $Fe_2O_3$ each series up to 20 mole % $Fe_2O_3$, the apparent upper limit to achieving frits with good sinterability and oxidative stability. Note that CTE values are highest at 0 mole % $Fe_2O_3$/maximum $TiO_2$ (20 and 35 mole %, respectively), become essentially constant with increasing $Fe_2O_3$ level at 60-65× $10^7$/° C., and then decrease substantially at $Fe_2O_3$>15 mole % (5 mole % and 20 mole % $TiO_2$, respectively), reaching a value of approximately $40 \times 10^{-7}$/° C. at 17.5-20 mole % $Fe_2O_3$. By comparison, the CTE of the $Sb_2O_3$-containing base frit is approximately $70$-$80 \times 10^{-7}$/° C.

Figure 3:
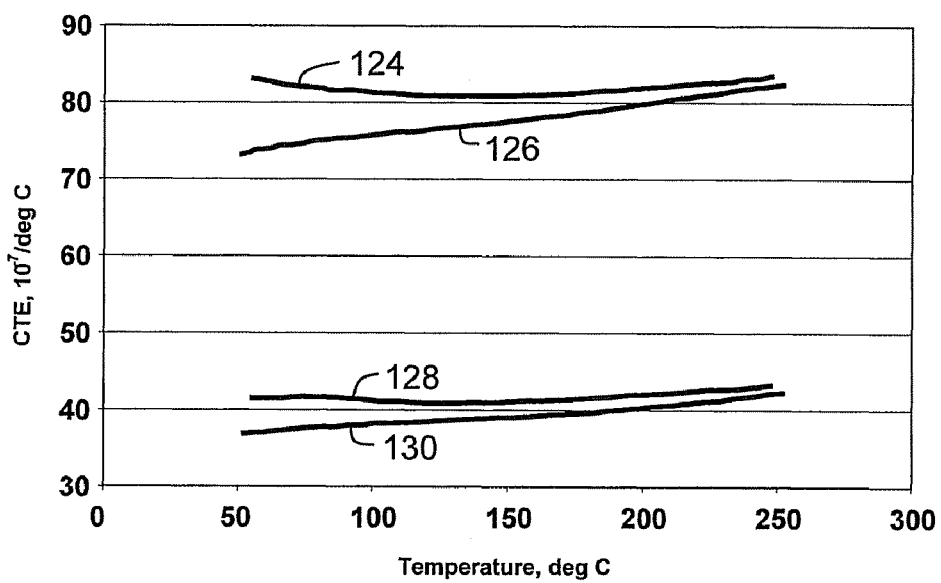
FIG. 3 is a plot comparing CTE as a function of temperature for an Sb-free frit according to embodiments of the present invention and an Sb-containing frit under both heating and cooling conditions.

A more direct comparison of CTE between the $Sb_2O_3$-containing and $Sb_2O_3$-free frits is shown in FIG. 3 where CTE curves are plotted for D1 under both heating and cooling conditions (curves 124 and 126, respectively) and D29 (re-melt of D24, Table 7) also under both heating and cooling conditions (curves 128 and 130, respectively). With a CTE value of approximately $40 \times 10^{-7}$/° C. for an unfilled frit, it is possible, with the addition of fillers such as β-eucryptite, to lower the CTE value of this frit close to that of fused silica.

The lab scale aqueous durability results for Sb-free frits were corroborated in a large scale sealing trial involving 85° C./85% RH exposure of laser-sealed samples. Shown in Table 8 are results of the trial and comparison between the standard OLED frit (D1, Table 1; used as a 70:30 blend with low CTE filler β-eucryptite), and an Sb-free frit (D29, remelt of D24, Table 7; used as an 80:20 wt. blend with low CTE filler β-quartz). Each frit blend was made into a paste, dispensed on several sheets of EAGLE$^{XG}$ display glass, presintered (Sb-containing standard, 325°-2 hr, air+400°-1 hr $N_2$; Sb-free, 325°-2 hr, air+425°-1 hr $N_2$), sealed to sheets of EAGLE$^{XG}$, placed in an 85° C./85% relative humidity environmental chamber, and then examined periodically for evidence of seal leakage and Ca metal breakdown. In total, there were 3 sheets of the Sb-containing control composition and 7 sheets of the antimony-free composition included in the study, with 9 sealed arrays of Ca metal tabs per sheet. As may be seen in Table 8, several arrays failed either immediately after sealing or within 100 hrs of placing them in 85° C./85% RH chamber for both the Sb-control and the Sb-free frits; these failures were related, most likely, to gross defects such as contamination present at random for each frit. However, after 96 hrs, no additional failures were observed for either the Sb-control or the Sb-free frit seals.

TABLE 8

|  | No. of good cells | | | |
| --- | --- | --- | --- | --- |
|  | Laser-sealed | At start of 85/85 | After 96 hrs of 85/85 | After 1056 hrs of 85/85 |
| Standard Sb-frit blend (70:30, D1:β-eucryptite) | 27 (3 sheets) | 25 | 24 | 24 |
| Sb-free frit blend (80:20, D29:β-quartz) | 63 (7 sheets) | 61 | 57 | 57 |

In summary, the excellent aqueous durability performance of Sb-vanadium phosphate frits was maintained without $Sb_2O_3$ by replacing the antimony oxide with a combination of $Fe_2O_3+TiO_2$, along with a small addition of ZnO to maintain flow and glass transition temperature ($T_g$). The presence of $Fe_2O_3$ was found to have the greatest effect in improving durability. However, in large amounts it raised $T_g$, thus degrading frit flow during sealing. In addition, frits with high $Fe_2O_3$ levels (equal to or greater than about 25 mole %) tended to be oxidatively unstable, with repeat samples fired to the same schedule (425° in $N_2$) exhibiting different colors (brown or black), with marked differences in the degree of flow. Although $TiO_2$ actually degraded aqueous durability to some extent when added by itself, the combination of ($Fe_2O_3+TiO_2$) appeared to be an ideal combination from the standpoint of obtaining laser-sealable frits with both high aqueous durability and low $T_g$ ($\leq 400°$).

Both lab bench tests in 90° C. distilled water as well as 85° C./85% relative humidity (RH) environmental chamber testing of laser-sealed samples indicate that frits based on the $Fe_2O_3$—$TiO_2$—ZnO-$V_2O_3$—$P_2O_3$ system are capable of forming a hermetic seal after laser-sealing that will withstand high humidity conditions for extended times ($\geq 1000$ hrs). An unexpected result of the ($Fe_2O_3+TiO_2$) replacement of $Sb_2O_3$ was that the CTE of the Sb-free frit without fillers decreased by approximately half (from 70-80×10$^{4}$/° C. to 35-45×10$^{-7}$/° C.), with only a minor increase in $T_g$ (from 355° C. to 370° C.). Frits with CTE values near 40×10$^{-7}$/° C. have the potential, with the addition of fillers such as β-eucryptite, of being able to seal fused silica and other low CTE substrates such as Kovar™.

Although several embodiments of the present invention has been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. An antimony-free glass comprising:
$V_2O_5$ (40-50 mole %)
$P_2O_5$ ($\geq 20$ mole % and <25 mole %)
ZnO (0-10 mole %)
$Fe_2O_3$ (>0 mole % and <25 mole %)
$TiO_2$ (>0 mole % and <25 mole %); and
wherein $TiO_2+Fe_2O_3$ is in the range from 20 mole % to 35 mole %.

2. The antimony-free glass according to claim 1, comprising:
$V_2O_5$ (40-50 mole %)
$P_2O_5$ ($\geq 20$ mole % and <25 mole %)
ZnO (5-10 mole %)
$Fe_2O_3$ (>0 mole % and <25 mole %)
$TiO_2$ (>0 mole % and <25 mole %); and
wherein $TiO_2+Fe_2O_3$ is in the range from 20 mole % to 35 mole %.

3. The antimony-free glass according to claim 1, wherein the antimony-free glass has the following composition:
$V_2O_5$ (40 mole %)
$P_2O_5$ (20 mole %)
ZnO (5 mole %)
$Fe_2O_3$ (>0 mole % and <25 mole %)
$TiO_2$ (>0 mole % and <25 mole %); and
wherein $TiO_2+Fe_2O_3$ is 35 mole %.

4. The antimony-free glass according to claim 1, wherein the glass has the following composition:
$V_2O_5$ (50 mole %)
$P_2O_5$ (20 mole %)
ZnO (10 mole %)
$Fe_2O_3$ (>10 mole % and <15 mole %)
$TiO_2$ (>5 mole % and <10 mole %); and
wherein $TiO_2+Fe_2O_3$ is 20 mole %.

5. The antimony-free glass according to claim 1, wherein the antimony-free glass has a $T_g \leq 400°$ C.

6. The antimony-free glass according to claim 1, wherein the antimony-free glass has a CTE in the range from 35× 10$^{-7}$/° C. to 45×10$^{7}$/° C.

7. The antimony-free glass according to claim 1, wherein the antimony-free glass comprises a glass frit.

8. The antimony-free glass according to claim 7, wherein the glass frit further comprises a CTE lowering filler.

9. An antimony-free glass consisting of:
$V_2O_5$ (40-50 mole %)
$P_2O_5$ ($\geq 20$ mole % and <25 mole %)
ZnO (0-10 mole %)
$Fe_2O_3$ (>0 mole % and $\leq 20$ mole %)
$TiO_2$ (>0 mole % and $\leq 20$ mole %); and
wherein $TiO_2+Fe_2O_3$ is in the range from 20 mole % to 35 mole %.

10. The antimony-free glass according to claim 9, wherein:
$V_2O_5$ (40-50 mole %)
$P_2O_5$ ($\geq 20$ mole % and <25 mole %)
ZnO (5-10 mole %)
$Fe_2O_3$ (>0 mole % and $\leq 20$ mole %)

TiO$_2$ (>0 mole % and ≦20 mole %); and
wherein TiO$_2$+Fe$_2$O$_3$ is in the range from 20 mole % to 35 mole %.

11. A glass package comprising:
a first glass plate;
a second glass plate; and
a frit that connects the first glass plate to the second glass plate and forms an hermetic seal therebetween, the frit including an antimony-free glass comprising:
V$_2$O$_5$ (40-50 mole %)
P$_2$O$_5$ (≧20 mole % and <25 mole %)
ZnO (0-10 mole %)
Fe$_2$O$_3$ (>0 mole % and <25 mole %)
TiO$_2$ (>0 mole % and <25 mole %); and
wherein TiO$_2$+Fe$_2$O$_3$ is in the range from 20 mole % to 35 mole %.

12. The glass package according to claim 11, wherein the antimony-free glass comprises:
V$_2$O$_5$ (40 mole %)
P$_2$O$_5$ (20 mole %)
ZnO (5 mole %)
Fe$_2$O$_3$ (>0 mole % and <25 mole %)
TiO$_2$ (>0 mole % and <25 mole %); and
wherein TiO$_2$+Fe$_2$O$_3$ is 35 mole %.

13. The glass package according to claim 11, wherein the antimony-free glass comprises:
V$_2$O$_5$ (50 mole %)
P$_2$O$_5$ (20 mole %)
ZnO (10 mole %)
Fe$_2$O$_3$ (>10 mole % and <15 mole %)
TiO$_2$ (>5 mole % and <10 mole %); and
wherein TiO$_2$+Fe$_2$O$_3$ is 20 mole %.

14. The glass package according to claim 11, wherein the antimony-free glass comprises:
V$_2$O$_5$ (40-50 mole %)
P$_2$O$_5$ (≧20 mole % and <25 mole %)
ZnO (5-10 mole %)
Fe$_2$O$_3$ (>0 mole % and <25 mole %)
TiO$_2$ (>0 mole % and <25 mole %); and
wherein TiO$_2$+Fe$_2$O$_3$ is in the range from 20 mole % to 35 mole %.

15. The glass package according to claim 11, wherein the antimony-free glass has a Tg≦400° C.

16. The glass package according to claim 11, wherein the antimony-free glass has a CTE in the range from 35×10$^{-7}$/° C. to 45×10$^{-7}$/° C.

17. The glass package according to claim 11, wherein the frit comprises a CTE-lowering filler.

18. The glass package according to claim 11, further comprising an organic material disposed between the first and second glass plates.

19. The glass package according to claim 11, wherein the organic material comprises an organic light emitting diode.

* * * * *